United States Patent [19]

Itakura et al.

[11] Patent Number: 4,709,408
[45] Date of Patent: Nov. 24, 1987

[54] PHASED LOCK LOOP SYNCHRONOUS DETECTING SYSTEM WITH AN AUTOMATIC FREQUENCY TUNING CIRCUIT

[75] Inventors: Tetsuro Itakura; Yoshitaka Kasagi; Mikio Koyama; Chikashi Nakagawara, all of Yokohama, Japan

[73] Assignee: Kabushiki Kaisha Toshiba, Kawasaki, Japan

[21] Appl. No.: 760,984

[22] Filed: Jul. 31, 1985

[30] Foreign Application Priority Data

Sep. 29, 1984 [JP] Japan ................................. 59-204846

[51] Int. Cl.$^4$ .............................................. H04B 1/16
[52] U.S. Cl. .................................. 455/260; 455/265; 329/50; 329/124
[58] Field of Search ........................ 455/192, 207–209, 455/260, 263; 358/195.1; 329/50, 122, 124

[56] References Cited

U.S. PATENT DOCUMENTS

| | | | |
|---|---|---|---|
| 4,091,410 | 5/1978 | Citta | 358/195.1 |
| 4,261,016 | 4/1981 | Hongu et al. | 358/195.1 |
| 4,283,792 | 8/1981 | Hongu et al. | 358/195.1 |
| 4,322,751 | 3/1982 | Hongu et al. | 358/195.1 |
| 4,470,145 | 9/1984 | Williams | 329/124 |

FOREIGN PATENT DOCUMENTS

| | | |
|---|---|---|
| 0080280 | 2/1983 | European Pat. Off. |
| 11246 | 3/1981 | Japan |
| 11247 | 3/1981 | Japan |
| 2021339 | 11/1979 | United Kingdom |

OTHER PUBLICATIONS

IEEE Transactions on Consumer Electronics, vol. CE-29, No. 3, 8/1983.

*Primary Examiner*—Jin F. Ng
*Attorney, Agent, or Firm*—Cushman, Darby & Cushman

[57] ABSTRACT

A circuit for processing an intermediate frequency signal comprises a limiter connected to receive the intermediate frequency signal to generate a carrier component of the intermediate frequency signal as an output, a phase locked loop circuit connected to receive one of the intermediate frequency signal and the carrier component from the limiter to generate an output signal which is phase-locked onto the carrier component of the intermediate frequency signal, a synchronous detector for synchronously detecting the intermediate frequency signal depended on the output signal from the phase locked loop circuit, and an automatic frequency circuit connected to receive the carrier component from the limiter and the output signal from the phase locked loop circuit to generate an output signal, as an automatic frequency tuning signal, in response to a frequency difference therebetween.

10 Claims, 6 Drawing Figures

F I G. 3
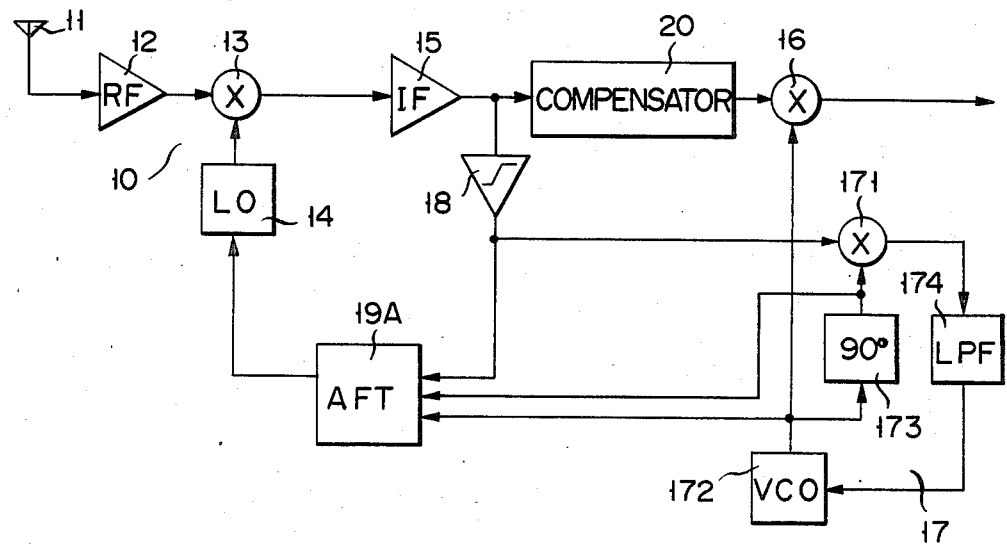
F I G. 4
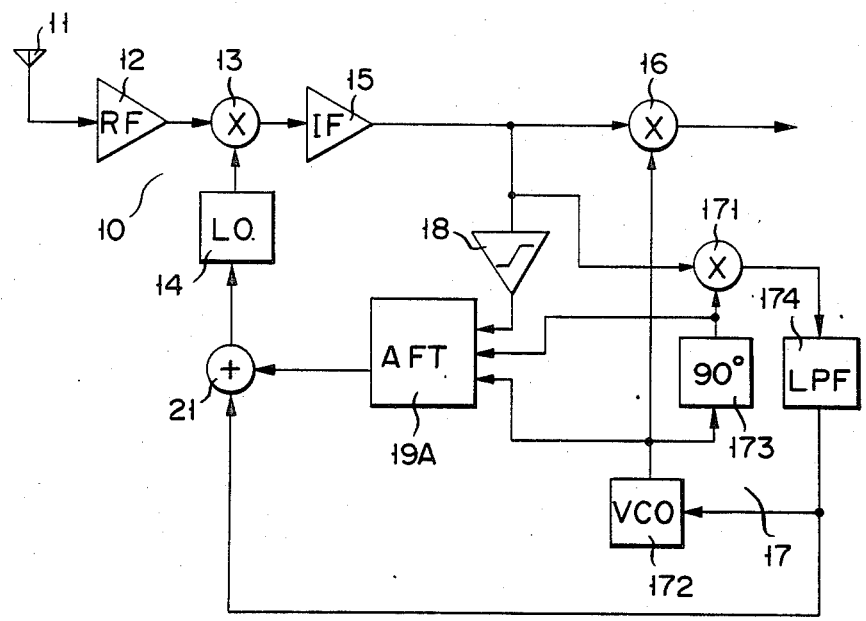

PHASED LOCK LOOP SYNCHRONOUS DETECTING SYSTEM WITH AN AUTOMATIC FREQUENCY TUNING CIRCUIT

BACKGROUND OF THE INVENTION

This invention relates to a circuit for processing an intermediate frequency signal and, in particular, an improved circuit suitable for an automatic frequency tuning (AFT) circuit and a synchronous detector section of a television receiver.

In general, a television receiver requires an AFT circuit for automatically tuning the carrier of a video intermediate frequency signal, which is output from a tuner section, into a predetermined frequency, for example, 58.75 MHz. Conventionally, a pseudo-synchronous detection circuit system equipped with the AFT circuit is used as this type of intermediate frequency processing circuit. In this system, the carrier of a video intermediate frequency signal, which is amplified by an intermediate frequency signal amplifier, is extracted by a limiter. The output of the limiter is FM-detected by the AFT circuit and taken out as an AFT signal. The output of the limiter is also input to a video signal detector and used as a carrier for video signal detection (reproduction).

This type of pseudo-synchronous detection circuit system, though being simpler in its arrangement, is liable to produce a quadrature distortion upon detection and thus produce an undesired buzz beat. For this reason, a PLL synchronous detection circuit system has recently been adopted which utilizes a phase locked loop (PLL) circuit as an intermediate frequency signal processing circuit. In this circuit system, therefore, the output of the voltage-controlled oscillator (VCO) of the PLL circuit is used as a detection signal for a video signal detector. That is, the oscillation output of the VCO is phase-locked onto the itermediate frequency signal. First, a signal which is obtained by 90° phase-shifting the oscillation output of the VCO by virtue of a 90° phase shifter is compared, by a phase comparator, with the output of the intermediate frequency signal amplifier. The output of the phase comparator, including a phase error signal, is convert through a low-pass filter to a DC voltage. The DC voltage is used as a control voltage of the VCO.

The output of the intermediate frequency signal amplifier is input through the limiter to the AFT circuit. The AFT circuit extracts the carrier of the intermediate frequency signal through the 90° phase shifter and bandpass filter. A multiplier is used to multiply this carrier with the intermediate frequency signal, and a result of the multiplication is taken out as an AFT signal through the low-pass filter. That is, the AFT circuit judges whether or not the carrier frequency coincides with the video intermediate frequency.

In this case, however, the performance of the AFT circuit is adversely affected by, for example, an error component of an element, such as the above-mentioned bandpass filter, and an "offsetting" phenomenon inherent in the multiplier. It is, therefore, impossible to exactly and automatically adjust the video intermediate frequency.

There exists a difference or discrepancy between the free-running oscillation frequency of the VCO in the PLL circuit section and the carrier frequency of the video intermediate frequency signal which is output from the intermediate frequency signal amplifier. Since, however, it is necessary to broaden the frequency pull-in range upon synchronization at the PLL circuit, it is impossible to narrow the noise bandwidth. In the PLL circuit, therefore, only the carrier component of the video intermediate frequency signal cannot be reproduced exactly, leaving its sideband components behind. Even in this circuit system, the video signal detector cannot detect an exact video detection.

In order to solve the above-mentioned problem, two low-pass filters, having a different time constant, are used in the PLL circuit. It has been the current practice to switch, once the PLL circuit is phase-locked onto the video intermediate frequency, the time constant of the filter in the loop in a direction in which the noise bandwidth is narrowed. It is, therefore, necessary to provide a change-over switch as well as a judgement circuit for judging whether or not the PLL circuit is brought into a phase-locked state. If such an associated circuit is formed as an IC circuit, a greater number of pins are required, offering a bar to a high density integration.

In order to acquire an initial pull-in range, the PLL circuit is required to set the frequency of the VCO within a broader variable range. With a pull-in noise band narrowed, on the other hand, the PLL circuit should set the frequency of the VCO within a narrower variable range so that the phase jitter component of the VCO output does not overlap the video detection output as a noise. In general, a voltage-controlled crystal oscillator (VCXO) using a crystal resonator is known as a VCO of a smaller phase jitter. Since the VCXO is much narrower in its frequency variable range than the ordinary VCO without the crystal resonator, it has been believed inapplicable to the above-mentioned PLL synchronous detection circuit system. In this type of circuit system, the situation exists under which the PLL circuit cannot set a possible noise bandwidth to be so narrow, in spite of the fact that the PLL circuit is effective to suppress the phase jitters of the VCO. For this reason, the video detection output unavoidably involves a quadrature distortion, noises, etc., presenting a bar to an enhanced video detection performance.

Furthermore, since the bandpass filter of the AFT circuit section is externally provided in this type of circuit system, the number of pins required is increased in spite of an attempted IC version.

SUMMARY OF THE INVENTION

It is, therefore, an object of this invention to provide a new and improved circuit for processing an intermediate frequency signal, whereby it is possible to improve an automatic frequency adjusting capability in an AFT circuit, as well as a synchronous detection capability in a PLL synchronous detector.

Another object of this invention is to provide an improved intermediate frequency signal processing circuit which is suitable for IC version.

According to this invention, there is provided a circuit for processing an intermediate frequency signal, comprising a limiter connected to receive the intermediate frequency signal to generate a carrier component of the intermediate frequency signal as an output;

a phase locked loop circuit connected to receive one of the intermediate frequency signal and the carrier component from the limiter to generate an output signal which is phase-locked onto the carrier component of the intermediate frequency signal;

a synchronous detector for synchronously detecting the intermediate frequency signal depended on the output signal from the phase locked loop circuit; and an automatic frequency circuit connected to receive the carrier component from the limiter and the output signal from the phase locked loop circuit to generate an output signal, as an automatic frequency tuning signal, in response to a frequency difference therebetween.

BRIEF DESCRIPTION OF THE DRAWINGS

These and other objects and features of this invention can be understood by reference to the accompanying drawings, in which:

FIGS. 3 to 5, each, show an intermediate frequency signal processing circuit according to another embodiment of this invention.

DETAILED DESCRIPTION OF THE PREFERRED EMBODIMENTS

The embodiments of this invention will be explained below in more detail by reference to the accompanying drawings.

Figure 1:
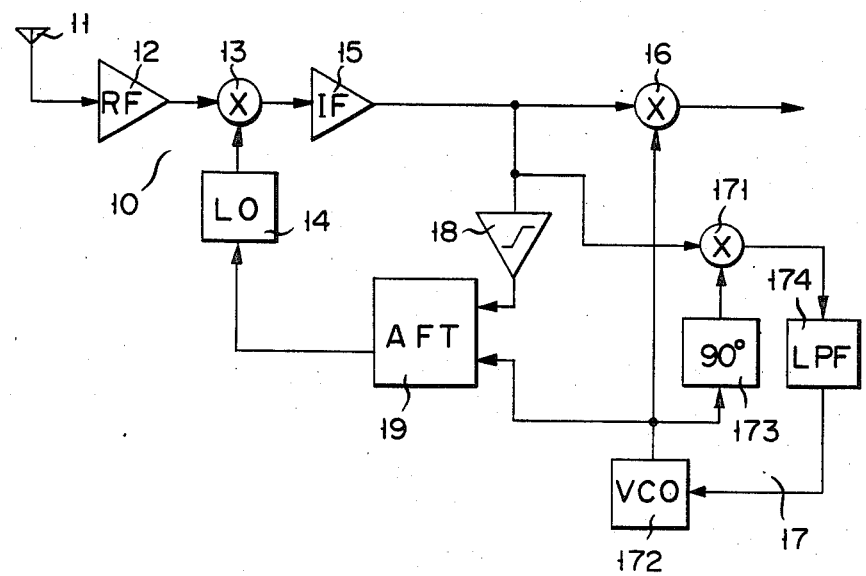
FIG. 1 is a block diagram showing an intermediate frequency signal processing circuit according to one embodiment of this invention.

FIG. 1 shows one embodiment of this invention as applied to a television receiver. In a tuner section 10, a high frequency signal which is input from an antenna 11 is supplied through a high frequency (RF) signal amplifier 12 to a multiplier 13, where it is mixed with a local oscillation output from a local oscillator 14 to obtain a video intermediate frequency signal. This video intermediate frequency signal is supplied to a video signal detector 16 and phase comparator 171 in a phase locked loop (PLL) circuit 17 after having been amplified by an intermediate frequency signal amplifier 15. The phase comparator 171 performs a phase comparison between the output of the intermediate frequency signal amplifier 15 and a phase shift comparison signal which is obtained by phase-shifting the oscillation output of a voltage-controlled oscillator (VCO) 172 using a 90° phase shifter 173 17. The output of the phase comparator 171, containing phase error information, is supplied to a low-pass filter 174 in the PLL circuit where it is integrated to obtain a DC voltage. The DC voltage of the low-pass filter 174 is supplied, as a control voltage, to an oscillation frequency control terminal of the VCO 172. The oscillation output of the VCO 172 is supplied, as a video detection signal, to the video signal detector 16.

An automatic frequency tuning (AFT) circuit 19, on the other hand, is supplied with two input signals, one of which is supplied from the intermediate frequency signal amplifier 15 through a limiter 18 and the other of which is supplied from the VCO 172 in the PLL circuit 17.

The AFT circuit 19 generates an AFT signal by not only using the carrier frequency of the output of the video intermediate frequency signal amplifier, as in the prior art, but also by using as a voltage or a current indicative of the difference between the output frequency of the VCO 172 in the PLL circuit 17 and the carrier frequency of the video intermediate frequency signal. The AFT circuit 19 is configured, for example, as shown in FIG. 2.

Figure 2:
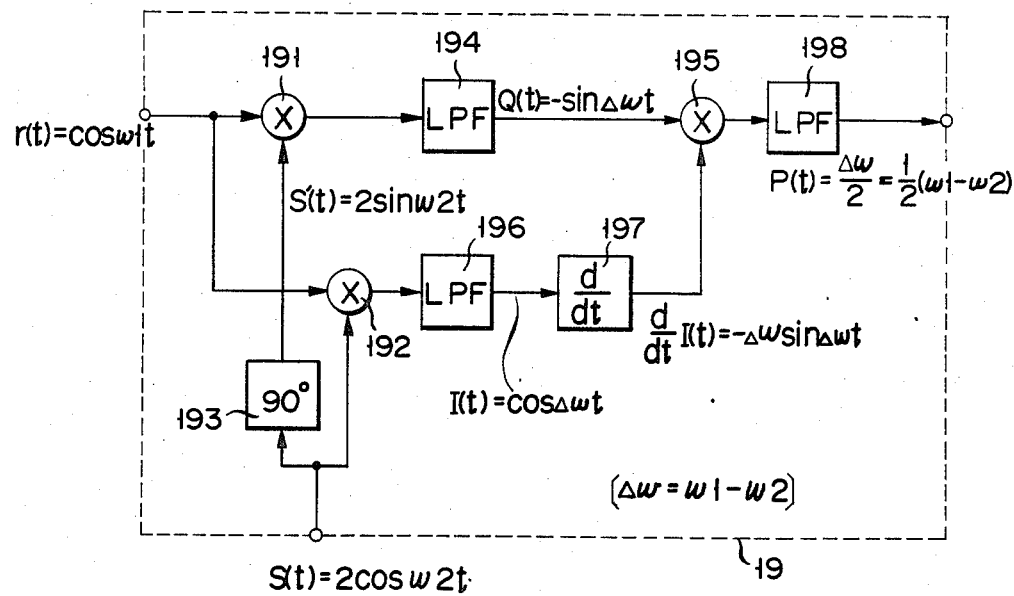
FIG. 2 is a block diagram showing a detail of an AFT circuit section of FIG. 1.

In FIG. 2, the first and second input signals $\gamma(t)$ and $S(t)$ are represented as $\gamma(t) = \cos \omega_1 t$ and $S(t) = 2 \cos \omega_2 t$, respectively. The first input signal is supplied to one input terminal of each of two multipliers 191 and 192, while, on the other hand, the second input signal is supplied, as a signal $S'(t) = 2 \sin \omega_2 t$, to the other input terminal of the first multiplier 191 through a 90° phase shifter 193 and directly to the other input terminal of the second multiplier 192. The output of the first multiplier 191 is fed, as a signal $Q(t) = -\sin \Delta\omega t$, to one input terminal of a third multiplier 195 through a low-pass filter 194, and the output of the second multiplier 192 is fed to a low-pass filter 196 where it is output as $I(t) = \cos \Delta\omega t$. The signal $I(t)$ is differentiated by a differentiator 197 to yield a signal:

$$\frac{d}{dt} I(t) = -\Delta\omega \sin \Delta\omega t$$

The signal $$\frac{d}{dt} I(t)$$

is delivered to the other input terminal of the third multiplier 195, provided:

$$\Delta\omega = \omega_1 - \omega_2$$

The multiplication output of the multiplier 195 is supplied to a low-pass filter 198 where it is output as:

$$P(t) \left[ = \frac{\Delta\omega}{2} = \frac{1}{2} (\omega_1 - \omega_2) \right]$$

which corresponds to a frequency difference between the input signals $\gamma(t)$ and $S(t)$. In this way, the output of the AFT circuit 19 is supplied to the local oscillator 14, thus performing an AFT operation.

In the intermediate frequency signal processing circuit, even if the frequency pull-in range on synchronization in the PLL circuit 17 is set to be narrower, a corresponding deficiency is compensated for by the AFT circuit 19, thereby achieving a compatibility between the broader pull-in range required at the initial operation time of the PLL circuit and the narrow pull-in range required after the phase lock is achieved.

That is, when the output frequency of the VCO 172 in the PLL circuit 17 is largely deviated from the carrier frequency of the video intermediate frequency signal, the phase comparison output which has passed through the low-pass filter 174 is substantially at a zero level and thus the VCO 172 is in the free running state. If the VCO 172 is comprised of a voltage-controlled crystal oscillator (VCXO) of a narrower variable range, it is oscillated in a fairly steady running state. At this time, the AFT circuit 19 of the processing circuit generates an AFT signal, noting that the AFT signal is obtained by converting a frequency difference between the output frequency of the VCO 172 and the carrier frequency of the video intermediate frequency signal to a current or a voltage. As a result, the AFT operation is performed so as to obtain a coincidence between the carrier frequency of the video intermediate frequency signal and the output frequency of the VCO 172.

If such a coincidence occurs through the AFT operation, the output phase of the VCO 172 in the PLL circuit is made coincident with the carrier phase of the video intermediate frequency signal. As a result, a video signal of better accuracy can be detected by the output of the VCO 172.

As set out above, no broader frequency pull-in range is necessary in the PLL circuit 17, and thus the frequency variable range of the VCO 172 may be made narrower. Since the noise bandwidth of the loop had initially been made narrower, it is not necessary to effect a switching from one low-pass filter to the other as in the conventional circuit, so that the noise bandpass filter is switched. The frequency variable range may be narrowed even with respect to the phase jitters of the VCO 172, permitting the direct use of, for example, a VCXO of a smaller jitter level and thus enhancing detection performance. In addition, the frequency pull-in time can be shortened, because the AFT circuit 19 permits the carrier frequency of the video intermediate frequency signal to coincide with the frequency of the VCO 172.

FIG. 3 shows an intermediate frequency signal processing circuit according to another embodiment of this invention. In this embodiment, the same reference numerals are employed to designate parts or elements corresponding to those shown in FIG. 1. The embodiment of FIG. 3 is the same as the embodiment of FIG. 1, except for the location of a limiter and the addition of a phase compensator 20. An AFT circuit 19A will be explained below. In this embodiment, a signal is input through the limiter 18 to the phase comparator 171 in a PLL circuit 17, thus enhancing the detection efficiency of a PLL synchronous detection system. At this time, a phase shift corresponding to a time lag resulting from the limiter occurs between a video detection signal which is an output of a VCO 172 and the carrier of the video intermediate frequency signal which is an input of a video signal detector 16. This phase shift can be compensated for by providing the phase compensator 20. The phase compensator 20 is connected to the input section of the video signal detector 16 and comprised of, for example, a buffer amplifier or a passive delay circuit.

In the embodiment of FIG. 3, the video detection signal which is input to the video signal detector 16 is substantially free from any side band components of the video intermediate frequency signal and can be taken out as a signal unaffected by any jitter of the VCO 172. An AFT circuit 19A of the embodiment of FIG. 3 receives, as a third input signal, an output from a 90° phase shifter 173 in the PLL circuit 17 and permits the elimination of the 90° phase shifter 193 from the AFT circuit 19 of FIG. 2.

In the television receiver, however, when a conversion is made to the video intermediate frequency signal, the carrier per se of the video intermediate frequency signal sometimes receives a jitter due to the jitter of the local oscillator. When such jitter occur, noise components emerge on the video signal which is an output of the video detector. In order to eliminate the noise components, an output of the phase comparator 171 which pass through the low-pass filter 174 may be supplied, together with an output of an AFT circuit 19A, to an adder 21, as shown in FIG. 4, the output of which is supplied as an AFT voltage to an oscillation frequency control terminal of the local oscillator 14.

Now suppose that, in the embodiment of FIG. 4, an automatic frequency adjustment is made through the AFT operation and that the PLL circuit 17 is in the phase-locked state. Then, $f_{VCO}$, $f_{RF}$, $f_{LO}$ and $f_{IF}$ can be expressed as follows:

$$f_{VCO} = \cos \omega IFt,$$

provided that no jitters are involved and that the side band components are eliminated.

$$f_{RF} = \{A + P(t)\} \cos \omega RFt,$$

(P(t): video signal)

$$f_{LO} = \cos (\omega LOt + \Delta\omega t)$$

($\Delta\omega t$: jitter components of the local oscillator)

$$f_{IF} = \{A + P(t)\} \cos \}\omega IF(t) + \Delta\omega t\}$$

$(\omega IF = \omega LO - \omega RF)$
where
$f_{IF}$: video intermediate frequency signal;
$f_{RF}$: output of a high frequency signal amplifier;
$f_{LO}$: output of the local oscillator 14; and
$f_{VCO}$: output of the VCO 172.

With the linear operation area of the multiplier of the phase comparator 171 narrowed to have a limiting effect, the output of the phase comparator 171, $f_{PD}$, is given by:

$$f_{PD} = \sin \omega IFt \times \cos (\omega IFt + \Delta\omega t)$$
$$= \frac{1}{2} \{\sin (2\omega IFt + \Delta\omega t) - \sin \Delta\omega t\}$$

Here, the output of the low-pass filter 174 becomes $$-\tfrac{1}{2} \sin \Delta\omega t$$

and thus the jitter components are taken out. The resultant signal is fed back to the local oscillator 14, thereby suppressing such jitter components.

Figure 5:
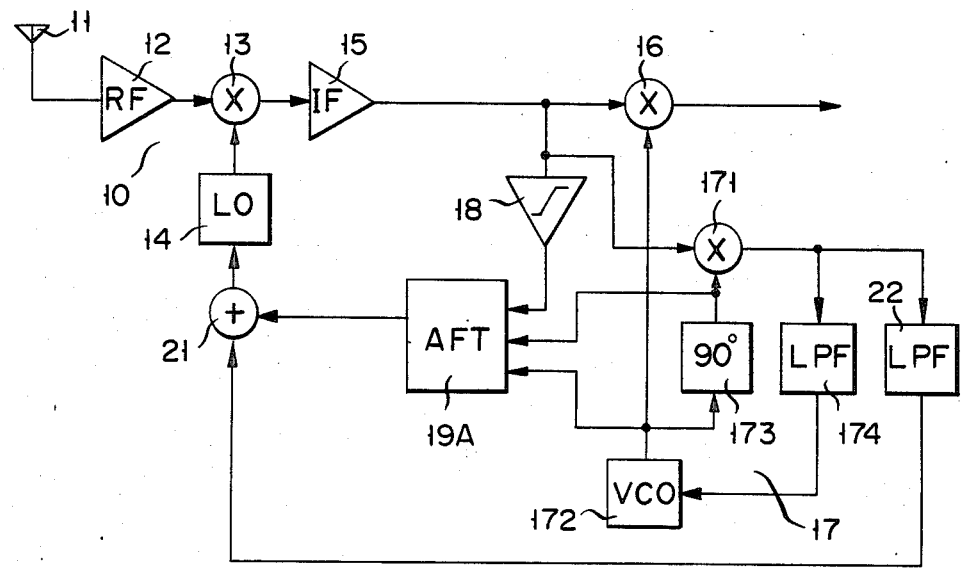
Figure 6:
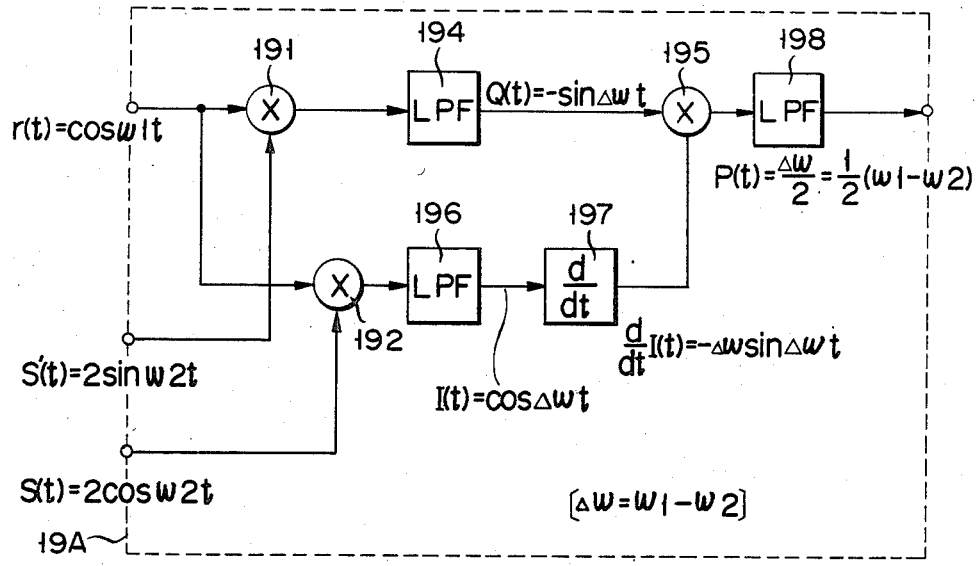
FIG. 6 is a block diagram showing a detail of an AFT circuit section of FIGS. 3 to 5.

Although, in the embodiment of FIG. 4, the output of the low-pass filter 174 in the PLL circuit 17 is fed back to the local oscillator 14, a special low-pass filter 22 may be provided, as shown in FIG. 5, so as to take, from within a PLL circuit 17, a signal which is fed back to a local oscillator 14. This permits a greater latitude to be allowed in setting the loop characteristic. In FIGS. 4 and 5, the same reference numerals are employed to designate parts or elements corresponding to those shown in FIG. 1. Further, explanation is, therefore, omitted.

As set out above, with the intermediate frequency signal processing circuit according to this invention it is possible to readily narrow the loop noise bandpass width. It is also possible to obtain a detection signal, substantially free from the phase jitters, with the side band components of the intermediate frequency signal suppressed. As a result, a detection signal substantially free from a quadrature distortion and noise components can be obtained with the detection capability greatly enhanced. Furthermore, the intermediate frequency signal processing circuit obviates the necessity of using a bandpass filter, as well as a lock-in state judging circuit and changeover switch in the PLL circuit, as in the case of the conventional counterpart. This feature eliminates the problem of increasing the number of pins required when an IN version is obtained, and assures a simplified circuit arrangement as a whole.

This invention is not restricted to the abovementioned illustrative embodiments and can be varied or modified without departing from the spirit and scope of this invention.

For example, this invention can be applied to not only a television receiver, but also to an AM receiver.

What is claimed is:

1. A phase locked loop synchronous detecting system with an automatic frequency tuning circuit, said system comprising:

means for generating a high frequency signal including a carrier component and a signal component to be synchronously detected;

local oscillator means for generating a local oscillation signal according to a supplied frequency tuning signal;

mixing means for receiving said high frequency signal from said generating means and said local oscillation signal from said local oscillator means, and for generating a predetermined intermediate frequency signal including said carrier component and said signal component to be synchronously detected;

intermediate frequency signal amplifier means for receiving and amplifying said intermediate frequency signal from said mixing means to produce an amplified intermediate frequency signal;

limiter means for receiving said amplified intermediate frequency signal and outputting a signal indicative of said carrier component of said intermediate frequency signal;

a phase locked loop circuit including: (a) phase comparator means for receiving, as a phase comparison reference signal, one of said intermediate frequency signal from said intermediate frequency signal amplifier means and said carrier component from said limiter means; (b) a first low-phase filter for receiving an output of said phase comparator means and producing a low pass filtered output; (c) voltage-controlled oscillator means for receiving said output of said first low-pass filter means, and for oscillating an output signal having substantially the same frequency as said intermediate frequency signal; and (d) first 90° phase shifter means for receiving said output signal of said voltage-controlled oscillator means to produce a 90° phase-shifted signal and for supplying said 90° phase-shifted signal to said phase comparator means to be compared with said phase comparison reference signal;

synchronous detector means for receiving said amplified intermediate frequency signal from said intermediate frequency signal amplifier means and said output signal from said voltage controlled oscillator means, and for generating a synchronous detection signal; and automatic frequency tuning means for receiving said carrier component from said limiter means and said output signal from said voltage-controlled oscillator means, and supplying a signal, corresponding to a frequency difference between said carrier component and said output signal from said voltage-controlled oscillator means, to said local oscillator means as said automatic frequency tuning signal.

2. A system according to claim 1, wherein said phase comparator means of said phase locked loop circuit receives said amplified intermediate frequency signal from said intermediate frequency signal amplifier, as said phase comparison reference signal.

3. A system according to claim 1, wherein said phase comparator means of said phase looked loop circuit receives said carrier component from said limiter means as said phase comparison reference signal.

4. A system according to claim 3, further comprising a phase compensation circuit coupled between said intermediate frequency signal amplifier and said synchronous detector means.

5. A system according to claim 1, in which said voltage-controlled oscillator means is a voltage-controlled crystal oscillator including a crystal resonator.

6. A system according to claim 5, further comprising means for extracting a jitter component of the carrier component of said intermediate frequency signal from the phase comparator means in said phase locked loop circuit, and means for adding together an output from said extracting means and an output from the automatic frequency tuning means to produce an an automatic frequency tuning signal.

7. A system according to claim 6, in which said extracting means extracts said jitter component through the first low-pass filter in said phase locked loop circuit.

8. A system according to claim 7, further comprising a second low pass filter and said extracting means extracts said jitter component through an eighth low-pass filter which is provided externally to said phase locked loop circuit.

9. A system according to claim 1, in which said automatic frequency tuning means comprises first and second multipliers supplied at one input terminal with the carrier component from the limiter means, second and third low-pass filters supplied with outputs of the first and second multipliers, respectively, a differentiator coupled to an output of the third low pass filter, a third multiplier directly supplied at one end with an output of the second low-pass filter and supplied at the other terminal with an output of the third low-pass filter through the differentiator, a fourth low-pass filter connected to receive an output of the third multiplier, and a second 90° phase shifter connected to the other input terminal of the first multiplier to impart a 90° phase shift to the output signal from said voltage controlled oscillator means of the phase locked loop circuit, in which an output signal from said voltage controlled oscillator means of the phase locked loop circuit is supplied directly to the other input terminal of the second multiplier and an output signal of the automatic frequency tuning means is derived from the fourth low-pass filter.

10. A system according to claim 1, in which said automatic frequency tuning circuit comprises first and second multipliers supplied at one input terminal with the carrier component from the limiter means, second and third low-pass filters supplied with outputs of the first and second multipliers, respectively, a third multiplier directly supplied with an output of the second low-pass filter and supplied with an output of the third low-pass filter through a differentiator, and a fourth low-pass filter supplied with an output of the third multiplier, in which an output from said first 90° phase shifter in the phase locked loop circuit is supplied to the input terminal of the first multiplier, an output from said voltage controlled oscillator means in the phase locked loop circuit is supplied to the other input terminal of the second multiplier, and an automatic frequency tuning signal is output from the fourth low-pass filter.

* * * * *